US008566675B2

(12) United States Patent
Radke

(10) Patent No.: US 8,566,675 B2
(45) Date of Patent: *Oct. 22, 2013

(54) DATA HANDLING

(75) Inventor: William H. Radke, Los Gatos, CA (US)

(73) Assignee: Micron Technology, Inc., Boise, ID (US)

( * ) Notice: Subject to any disclaimer, the term of this patent is extended or adjusted under 35 U.S.C. 154(b) by 377 days.

This patent is subject to a terminal disclaimer.

(21) Appl. No.: 12/814,885

(22) Filed: Jun. 14, 2010

(65) Prior Publication Data

US 2010/0251066 A1 Sep. 30, 2010

Related U.S. Application Data

(63) Continuation of application No. 11/513,571, filed on Aug. 31, 2006, now Pat. No. 7,739,576.

(51) Int. Cl.
H03M 13/00 (2006.01)

(52) U.S. Cl.
USPC ........... 714/774; 714/752; 714/758; 714/769; 711/103; 711/113; 711/118

(58) Field of Classification Search
USPC .......... 711/103, 113, 118; 714/752, 758, 769, 714/774
See application file for complete search history.

(56) References Cited

U.S. PATENT DOCUMENTS

| 5,459,850 | A | 10/1995 | Clay et al. |
| 5,754,567 | A | 5/1998 | Norman |
| 5,854,800 | A | 12/1998 | Thomann et al. |
| 5,864,569 | A | 1/1999 | Roohparvar |
| 5,923,682 | A | 7/1999 | Seyyedy |
| 6,076,182 | A | 6/2000 | Jeddeloh |
| 6,141,249 | A | 10/2000 | Estakhri et al. |
| 6,226,772 | B1 * | 5/2001 | Weng et al. ............... 714/781 |
| 6,279,072 | B1 | 8/2001 | Williams et al. |
| 6,741,253 | B2 | 5/2004 | Radke et al. |
| 6,838,331 | B2 | 1/2005 | Klein |
| 6,978,415 | B1 * | 12/2005 | Weng ........................ 714/781 |
| 7,010,645 | B2 | 3/2006 | Hetzler et al. |
| 7,739,576 | B2 * | 6/2010 | Radke ....................... 714/758 |
| 8,086,935 | B1 * | 12/2011 | Sheredy ..................... 714/760 |
| 2003/0115538 | A1 | 6/2003 | Derner et al. |
| 2004/0210709 | A1 | 10/2004 | Conley et al. |
| 2005/0172065 | A1 | 8/2005 | Keays |
| 2005/0268203 | A1 | 12/2005 | Keays et al. |
| 2005/0283650 | A1 | 12/2005 | Zhang et al. |
| 2006/0098484 | A1 | 5/2006 | Roohparvar |
| 2009/0150748 | A1 * | 6/2009 | Egner et al. ............... 714/758 |

* cited by examiner

Primary Examiner — Sam Rizk
(74) Attorney, Agent, or Firm — Leffert Jay & Polgaze, P.A.

(57) ABSTRACT

Methods and apparatus to facilitate determining or selecting a depth of error detection and/or error correction coverage, and detecting and/or correcting errors in data in accordance with the determined or selected depth of error detection and/or error correction coverage.

36 Claims, 10 Drawing Sheets

DATA HANDLING

RELATED APPLICATIONS

This application is a continuation of U.S. patent application Ser. No. 11/513,571, filed Aug. 31, 2006, now U.S. Pat. No. 7,739,576 and titled "VARIABLE STRENGTH ECC," which is commonly assigned and incorporated by reference in its entirety herein.

TECHNICAL FIELD

The present invention relates generally to integrated circuits and in particular the present invention relates to data error correction codes of memory devices.

BACKGROUND

Memory devices are typically provided as internal storage areas in the computer. The term memory identifies data storage that comes in the form of integrated circuit chips. There are several different types of memory used in modern electronics, one common type is RAM (random-access memory). RAM is characteristically found in use as main memory in a computer environment. RAM refers to read and write memory; that is, you can both write data into RAM and read data from RAM. This is in contrast to read-only memory (ROM), which permits you only to read data. Most RAM is volatile, which means that it requires a steady flow of electricity to maintain its contents. As soon as the power is turned off, whatever data was in RAM is lost.

Computers almost always contain a small amount of ROM that holds instructions for starting up the computer. Unlike RAM, ROM cannot be written to. An EEPROM (electrically erasable programmable read-only memory) is a special type non-volatile ROM that can be erased by exposing it to an electrical charge. EEPROM comprise a large number of memory cells having electrically isolated gates (floating gates). Data is stored in the memory cells in the form of charge on the floating gates. Charge is transported to or removed from the floating gates by specialized programming and erase operations, respectively. Other types of non-volatile memory and storage include, but are not limited to, Polymer Memory, Ferroelectric Random Access Memory (FeRAM), Ovionics Unified Memory (OUM), Nitride Read Only Memory (NROM), and Magnetoresistive Random Access Memory (MRAM).

In memory and memory systems, error correction codes (ECC's) allow errors in the data stored in the memory to be detected and in many cases corrected. ECC codes include block codes, that are associated with a block of stored data (a memory data sector), and stream codes, that are typically utilized with streams of transmitted data. ECC codes include, but are not limited to, Hamming codes, Reed-Solomon (R-S) codes, Bose-Chaudhuri-Hochquenghem (BCH) codes, circular redundancy check codes (CRC, it is noted herein that CRC codes are often only utilized for error detection), Golay codes, Reed-Muller codes, Goppa codes, and Denniston codes. In most memories and memory systems, error detection and/or ECC code generation is accomplished via a dedicated ECC hardware (referred to herein as ECC syndrome generators or ECC checkers) as the data is read in or out. Unlike error detection, error correction is typically a more difficult process and generally involves a time consuming algorithmic process. As a result, error correction of data that has been detected as corrupt is generally done by a microprocessor or specialized hardware that can be contained either in an external microprocessor, in an external memory controller or within the memory device itself.

The prevalence of errors in modern memory devices, and in non-volatile and Flash memory devices in particular, have been tending to increase with smaller device sizes, increased array density, lower operating voltages and through the storage of multiple data bits in memory cells via multiple charge storage centers/centroids per cell or through the use of multiple threshold voltage levels in multi-level cells (MLCs). In addition, increased active usage of non-volatile memory devices in electronic devices and increases in the amount and relative size (granularity) of the data being stored in these memory devices has tended to increase the incidence of operationally induced failures over long periods of active use due to due to physical damage, impurity migration, write fatigue, electrical transients, etc. This increase in the number of times data is written combined with the increasing prevalence in errors due to reductions in feature sizes or changes in memory technology can affect memory operation, data reliability and speed; increasing the incidence of uncorrectable data errors when the number of bit errors exceed the limits of the ECC code's correction ability and/or slowing the data rate of the memory device or memory system as these errors are corrected. A further complicating factor is that the ECC hardware implementation and/or space available to store ECC check bytes may differ from device to device rendering them potentially incompatible with each other or unable to provide the required level of error correction for the bit error rate being experienced.

For the reasons stated above, and for other reasons stated below which will become apparent to those skilled in the art upon reading and understanding the present specification, there is a need in the art for ECC apparatus and methods that allows for improved correction of data in memories.

DETAILED DESCRIPTION

Figure 1:
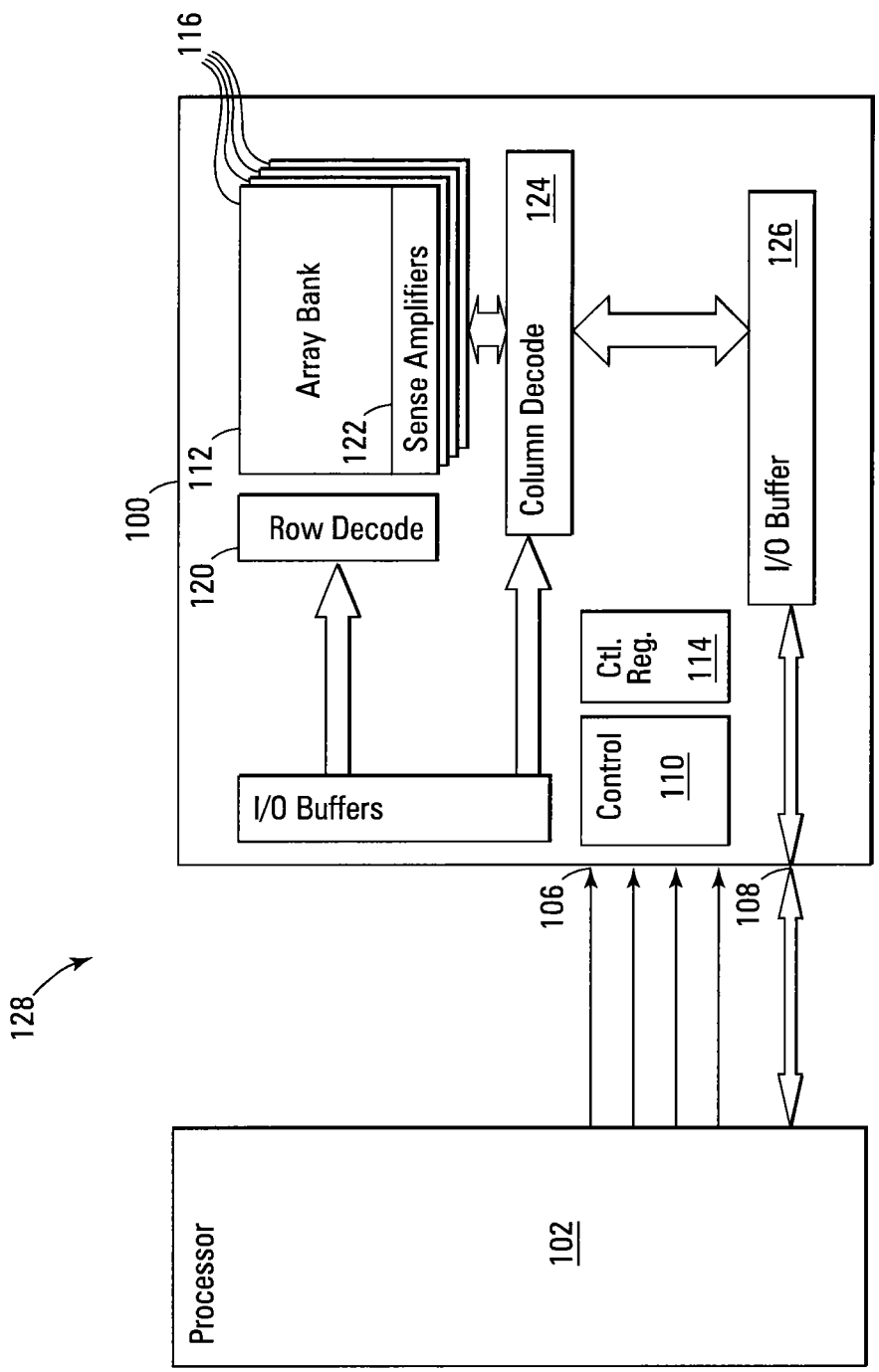
FIG. 1 is a simplified block diagram of a system containing a non-volatile memory device in accordance with an embodiment of the present invention.

In the following detailed description of the present embodiments, reference is made to the accompanying drawings that form a part hereof, and in which is shown by way of illustration specific present embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims and equivalents thereof.

Memory devices, control circuitry, or data handling routines, in accordance with embodiments of the present invention, facilitate the detection and correction of data in memory controllers, memory systems, and/or non-volatile memory devices by allowing the number of ECC check bytes being utilized to be varied to increase or decrease the ECC check depth. This allows the depth of the ECC coverage (the overall number of bit errors detectable and/or correctable in each sector by the stored ECC check bytes) to be selected based on the application (such as increased error correction or speed of access), the amount of available data storage for ECC check bytes in the overhead/spare area associated with the sector, the version of memory device or controller being utilized, or the number of errors being seen in the memory system, device, bank, erase block, or sector (the error incidence rate), while the base data size of the area covered by the ECC check bytes (typically one or more sectors) and ECC math base stays the same.

As stated above, modern memories are dealing with a greater incidence of errors in them. This is due to reductions in feature sizes, increased memory array/memory device densities, differing manufacturing processes, use of more advanced memory technologies, lower operating voltages, etc. In addition, in operating memory devices, electrostatic discharge (ESD) damage, write fatigue, electrical cross talk, and noise can also play a part in array damage or corruption of stored data. Therefore, the probability one or more bit errors in a given read memory segment or sector is increasing. However, most computer based systems assume that any stored data that has been read by the system is correct. As such, because of these manufacturing related or use-induced imperfections and errors, memory devices and other forms of computer usable storage or media (such as magnetic disks, hard drives, and optical media) are typically logically abstracted during use by various software drivers, management routines, and hardware support circuitry to appear to their host systems as virtual perfect data storage, without errors or defective regions. This abstraction of the memory device or other computer-usable storage generally is accomplished through the marking of bad memory blocks, replacement of defective blocks or memory elements with spare/redundant blocks or elements, and use of error correction methods, such as ECC codes, to detect and correct data errors in the retrieved data before it is utilized by the host system.

However, as a result of the increased incidence of errors, faster processing rates, and increasing data demands of modern computer-based systems, memory controllers and embedded ECC systems currently are being asked to deal with an increased number of situations where error correction is required. However, at the same time memory latency times (the time required for the memory system to provide the read data to the host) are decreasing and the data space reserved for the ECC code storage is generally limited or fixed in size. This can limit the depth (the overall number of errors the stored ECC check byte code can detect and/or correct) and algorithm complexity of the ECC coverage, while the number of errors that the ECC codes and algorithms are being asked to detect and correct are increasing.

In addition, as also stated above, in many memory devices, controllers, and/or memory systems the ECC encoding scheme is fixed to a specified or standardized size and generation/checking algorithm. This limits the memory system/controller/memory device to only operating with this ECC specification; incompatible or more capable devices cannot be utilized or must be de-tuned to match the specified ECC algorithm and number of ECC check bytes/symbols. Further, the ECC algorithm and/or number of ECC check bytes cannot be changed to increase or decrease ECC coverage depth depending on the error correction needs; increasing ECC depth when a higher incidence of errors occur or more data reliability is required, or decreasing depth with lower error rates, decreased ECC check byte storage area, and/or increased speed requirements. In particular, older memory device technologies or designs, while typically having lower overall error rates, generally have smaller areas set aside to store ECC check bytes due to their lower data densities and older ECC standards. Therefore these devices are problematic in integrating with new memory controllers or newer memory designs or devices which utilize larger ECC check byte storage areas and more complex ECC algorithms. Thus it is difficult to "right-size" the number of ECC check bytes and algorithms in prior art memory devices, controllers, and systems to adjust them to the memory composition and system use.

As stated above, memories typically utilize ECC codes to detect and correct a limited number of errors in stored user data. ECC codes, and block ECC codes in particular, are commonly based on specialized polynomial equations, where the stored ECC codes are the generated coefficients of a polynomial for the current data. When the data is read out of a memory the data integrity is checked by regenerating these coefficients from the read data; serially running the read data and stored ECC codes through an ECC generator/checker to generate syndromes of the polynomial, and checking to see of any syndrome is non-zero. If any of the generated syndromes is non-zero, an error has been detected. Once an error in read data is detected, the transfer of the data out of the memory device or system is halted and ECC correction algorithm is started. The ECC correction algorithm, generally speaking, solves for the zeros of the polynomial to locate the data word(s) and bit(s) within the data words that need to be corrected.

In utilizing error correction methodologies in memory devices or other computer usable storage, it would be desirable to be able to correct an infinite number of errors. However, for each error the ECC code/memory device can correct there is an overhead cost. Some of this increased overhead cost comes in the form of increased storage space required for storing the ECC codes to allow detection and correction errors in the stored data, and in increased size and complexity of the hardware circuits and/or software routines required to utilize the ECC codes and reduced speed of operation. In addition, ECC codes and algorithms are typically designed to allow for the detection of more errors than they can correct for in order to increase operational stability in the ECC algorithm. As such, efficient and practical ECC code error correction is typically limited by storage space requirements, and by complexity and speed of use of the selected ECC codes and algorithms. On the other hand, the actual incidences of individual symbol errors in prior art memory devices or computer usable storage has typically been low, so that the statistical odds of having more than a limited number of bit errors in a 512-byte sector of user data has been typically low enough in the past so that a limited ECC error detection and correction ability (thus having low additional storage requirements and a high speed of operation) has been sufficient for abstraction purposes. As stated above, with increasing data storage density in modern memory devices, decreased process feature sizes and memory cell spacing, there will generally be an increasing level of bit errors in the stored data.

Many memory device types contain both user data areas and overhead data areas. The overhead data areas contain overhead information for operation of the memory device, portion of the array, erase block and/or the user data area that the overhead data space is associated with. In particular, in non-volatile memory devices, such as Flash memory devices, each erase block typically contain a mixture of user data areas and overhead data areas. In Flash memory erase blocks, the overhead information typically includes, but is not limited to, erase block management (EBM) data, or sector status information. Flash memory devices also typically divide each erase block into a series of sectors, where the sectors each generally contain 512 bytes of user data space and an associated control or overhead area. One or more of the sectors are each typically written to a single row of the Flash memory array (also known as a physical page or column page or "page") within the erase block.

FIG. 1 details a simplified diagram of a system 128 incorporating of an embodiment of the present invention, having a memory device 100 connected to a host 102, which is typically a processing device or memory controller. The memory 100 has a control interface 106 and an address/data interface 108 that are each connected to the processing device 102 to allow memory read and write accesses. It is noted that in alternative embodiments, the address/data interface 108 can be divided into separate interfaces. Internal to the memory device a control state machine/control circuit 110 directs the internal operation; managing the memory array 112 and updating RAM control registers 114. The RAM control registers and tables 114 are utilized by the control state machine 110 during operation of the memory 100. The memory array 112 contains a sequence of memory banks or segments 116. Memory access addresses are received on the address/data interface 108 of the memory 100 and divided into a row and column address portions. On a read access the row address is latched and decoded by row decode circuit 120, which selects and activates a row page (not shown) of memory cells across a selected memory bank. The bit values encoded in the output of the selected row of memory cells are connected from a local bitline/string (not shown) to a global bitline (not shown) and detected by sense amplifiers 122 associated with the memory bank. The column address of the access is latched and decoded by the column decode circuit 124. The output of the column decode circuit selects the desired column data from the sense amplifier outputs and connected to the data buffer 126 for transfer from the memory device through the address/data interface 108. On a write access the row decode circuit 120 selects the row page and column decode circuit selects write sense amplifiers 122. Data values to be written are connected from the data buffer 126 to the data cache and then to the write data latches of the write sense amplifiers 122 selected by the column decode circuit 124 and written to the selected memory cells (not shown) of the memory array 112. In one embodiment, the written cells are then reselected by the row and column decode circuits 120, 124 and sense amplifiers 122 so that they can be read to verify that the correct values have been programmed into the selected memory cells. It is noted that in another embodiment of the present invention, the column decode 124 may be optionally placed between the memory array 112 and the sense amplifiers 122.

As stated above, one type of non-volatile memory is a Flash memory. A Flash memory is a type of EEPROM that is typically erased and reprogrammed in blocks instead of one byte at a time. A typical Flash memory comprises a memory array, which includes a large number of non-volatile memory cells. Each of the memory cells typically includes a conductive floating gate (or non-conductive floating node/charge trapping layer) field-effect transistor (FET) capable of holding a charge. The data in a cell is determined by the presence or absence of the charge in the floating gate. The cells are usually grouped into sections called "erase blocks." The memory cells of a Flash memory array are typically arranged into a "NOR" architecture (each cell directly coupled to a bit line) or a "NAND" architecture (cells coupled into "strings" of cells, such that each cell is coupled indirectly to a bit line and requires activating the other cells of the string for access). Each of the cells within an erase block can be electrically programmed in a random basis by charging the floating gate. The charge can be removed from the floating gate by a block erase operation, wherein all floating gate memory cells in the erase block are erased in a single operation.

It is noted that embodiments of the present invention are not limited to NAND or NOR architecture memory arrays or memory devices and can apply to other block erasing memory array architectures and memory devices, including, but not limited to AND and virtual ground architecture memory arrays and memory devices.

Because all the cells in an erase block of a Flash memory device are generally erased all at once, one cannot directly rewrite a Flash memory cell without first engaging in a block erase operation. EBM, typically under the control of an internal state machine, an external Flash memory controller, or software driver, provides an abstraction layer for this to the host (a processor or an external memory controller), allowing the Flash device to appear as a freely rewriteable device, including, but not limited to, managing the logical address to physical erase block translation mapping for reads and writes, the assignment of erased and available erase blocks for utilization, and the scheduling erase blocks that have been used and closed out for block erasure. Erase block management also allows for load leveling of the internal floating gate memory cells to help prevent write fatigue failure. Write fatigue is where the floating gate memory cell, after repetitive writes and erasures, no longer properly erases and removes charge from the floating gate. Load leveling procedures increase the mean time between failure of the erase block and Flash memory device as a whole.

In many modern Flash memory device implementations, the host interface and Erase Block Management routines additionally allow the Flash memory device to appear as a read/write mass storage device (i.e., a magnetic disk) to the host. One such approach is to conform the interface to the Flash memory to be identical to a standard interface for a conventional magnetic hard disk drive allowing the Flash memory device to appear as a block read/write mass storage device or disk.

Memory devices, control circuitry, or data handling routines, in accordance with embodiments of the present invention, facilitate the detection and correction of data in memory systems or devices by allowing the ECC check byte/symbol data size to be selected based on the requirements of the memory device, memory system, memory controller, the error rate, or the application (such as either an increase error coverage or speed of operation). In one embodiment of the present invention, a memory device or memory system can select from two or more differing ECC check byte sizes to allow the ECC coverage depth of the memory device or memory system to be adjusted. In another embodiment, two or more differing ECC check byte sizes are selected to allow the ECC coverage depth to be adjusted to allow for differing error rates, increased speed of operation, increased data reliability, or decreased ECC check byte/ECC code size and consequent utilization of the spare area. In a further embodiment, memory devices of differing technologies, design, spare area size, wear, or error rates can be utilized together by allowing ECC check byte size to be varied. In yet a further embodiment an ECC Syndrome Generator/Checker is adapted to allow for two or more differing ECC check byte data sizes. In another embodiment ECC syndrome generation, Berlekamp algorithm, and/or Chien search are adapted to allow for two or more differing ECC check byte data sizes for a given coverage area and math base. In yet another embodiment, a memory controller, memory system or memory device tags memory structures, such as, but not limited to, sectors, pages, erase blocks, memory segments, and memory array banks to identify the base ECC check byte size utilized in the memory structure. In a further embodiment, a different ECC check byte data size is utilized dependent on the type of memory being utilized and/or the data being stored, such as a MLC NAND Flash storing digital images (having a low data reliability requirement), an EEPROM storing boot code (requiring high data reliability), or a DRAM utilized as scratch pad memory (having a high access speed/low data reliability requirement). In yet a further embodiment, the ECC check byte data size and coding is adaptive based on the number of errors (such as, the instantaneous bit error rate for a selected memory area or device, the average bit error rate as indicated by a running average of the number of errors seen for each read operation on a selected memory area or device, or the incidence rate of uncorrectable errors for the selected memory area or device) and/or use level of the underlying memory area, such that as a memory area experiences an increasing wear level, increasing number of bit errors, or increasing number of unrecoverable data errors, the ECC check byte data size and coding scheme utilized in the area is increased to allow for greater data reliability. In some cases, this increased ECC coverage area and correction ability can be utilized by the memory device or system as an alternative to marking the memory area as bad and requiring that it be removed from use. It is noted that variable size ECC error codes of embodiments of the present invention may also be utilized in other computer usable storage devices than memory devices, including, but not limited to, magnetic disks, magnetic tapes, hard drives, or optical media.

Reed-Solomon error correction block codes are one of a number of block codes commonly utilized in memory device applications and embodiments of the present invention. It is noted that embodiments of the present invention utilize Bose-Chaudhuri-Hochquenghem (BCH) based ECC codes and algorithms, such as Reed-Solomon (R-S) codes. However, it is also noted that they can utilize other ECC codes, including, but not limited to, Hamming codes, circular redundancy check codes (CRC), Golay codes, Reed-Muller codes, Goppa codes, and Denniston codes. As stated above, with a block code generator, a block of data is fed into the block code generator to generate the ECC code to be stored associated with the data block in the memory device.

In one ECC generator/checker embodiment of the present invention, a Reed-Solomon code generator is fed a data sector of 512 bytes and generates either five or ten 9-bit symbols (formatted into either a 6 byte code or a 12 byte code) that form the ECC code to tag on to the end of the data block. Typically it requires 2 ECC symbols to correct an error, while only a single ECC symbol is required to simply detect. Therefore, from the ten 9-bit symbols of a 12 byte ECC code it is typically possible to detect up to 10 errors or correct up to 5 errors in the data sector as it is read from the memory device. From the five 9-bit symbols of the 6 byte ECC code it is typically possible to detect up to 5 errors or correct up to 2 errors (while detecting up to 3 errors overall) in the data sector as it is read from the memory device. As noted above, to promote stability in the ECC algorithm operation and prevent valid, but incorrect, ECC error correction solutions, ECC coding schemes are generally chosen so that they can detect more errors than they can correct as a safety margin.

ECC code generators typically serialize the data block into a data stream to generate the ECC code. In doing so, many ECC code generators utilize a Linear Feedback Shift Register (LFSR). A similar process is also generally utilized to check a read data block by utilizing the stored ECC code from the read data block and evaluating it against the stored data of the read data block to generate syndromes of the error polynomial to check for errors in the data. In generating an ECC code from a data sector/data block, the ECC code generator divides the user data of the stored data block into symbols of the same math base (such as 9-bit data symbols) as the ECC code it was stored with. It is noted that the math base of the ECC coding scheme typically determines the size of the data area (the number of bytes or sectors) being covered by the associated ECC check byte code.

In checking data block and its associated ECC code, the ECC code generator/code check hardware produces a stream of binary digits (Syndrome generation) in what is known as Syndrome Generator. If the stream of binary digits is all zeros, no errors have been detected in the read data block. If one or more non-zero bits are output, there is an error and further processing is required by the ECC correction algorithm to try to determine the location of the error(s) and correct them.

In determining the location of the errors, an ECC algorithm (such as a BCH-based Reed-Solomon code) utilizes the syndromes generated from the stored symbols of the ECC code and data block to compute an error location polynomial (ELP) that is used to locate the symbol(s) in the data block that are corrupted and the bit(s) within that symbol that are incorrect. In doing so, it utilizes a Berlekamp Algorithm to solve a series of equations to generate the error location polynomial in Galois fields in $2^N$ space. A Chien search is then conducted, by inserting each location into the error location polynomial to see if this is one of the bit locations that satisfies the error solution.

In embodiments of the present invention, the ECC data coverage area, math base of the symbols, and ECC algorithms of ECC generator/checkers are typically designed for a fixed ECC data coverage area, but have a variable number of associated ECC check bytes/symbols (a fixed number of user data sectors or bytes covered by each individual ECC check byte code, but the size of the ECC check byte code being variable to allow for increases or decreases in the number of errors detectable or correctable within the covered user data). The ECC algorithms of ECC checkers/syndrome generators are also typically designed for the largest ECC check byte code size that can be utilized. It is noted that a different LFSR registers/Syndrome generators, or ones with selectable feedback paths and coefficients, may be required for each different ECC check byte code size. The loops of the Berlekamp and Chien ECC algorithms of ECC generator/checker must then only be truncated or zero padded so that only the symbols contained within these smaller ECC check byte codes are utilized in checking the data.

Figure 2A:
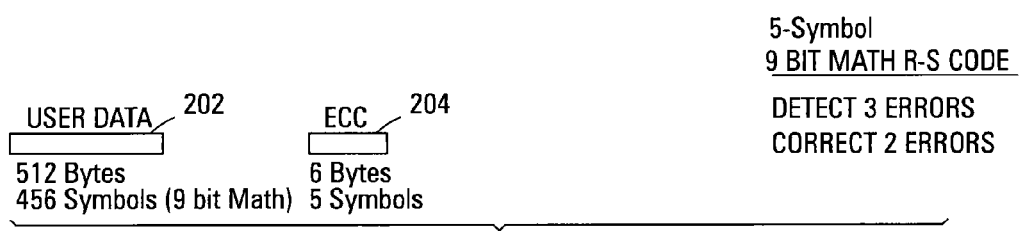
FIGS. 2A-2C detail user data and associated ECC codes in accordance with embodiments of the present invention.
Figure 2B:
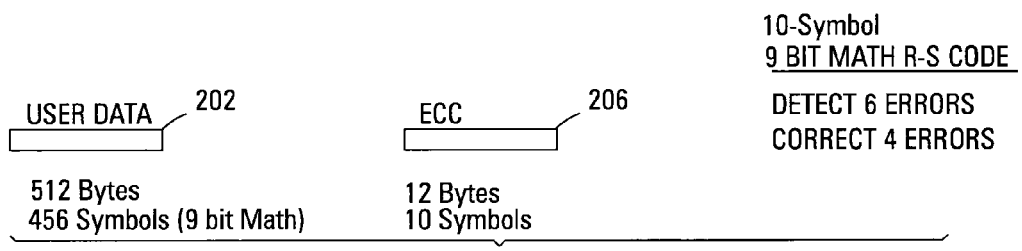

FIGS. 2A and 2B detail data sectors 202 and their associated 9-bit math Reed-Solomon ECC code 204, 206 of an embodiment of the present invention. In FIG. 2A, the user data is stored in a 512-byte sector 202 that is concurrent with the ECC coverage area and is divided into 456 9-bit symbols for ECC purposes. The ECC code 204 contains five 9-bit symbols stored in 6 bytes. The Reed-Solomon ECC encoding of the single data sector/ECC coverage area 202 and ECC code 204 are designed to allow for the detection of 3 symbol errors and the correction of 2 of those symbol errors. It is noted that, while the five 9-bit symbols allows an ECC detection range of 5 errors maximum or the ECC correction of 2 errors maximum (given the general rule of requiring 1 symbol for each error detection, while 2 symbols are required for each bit error correction), this encoding includes an additional error detection margin of 1 bit over the selected 2 bit correction ability to help foster predictable and stable operation of the ECC error correction.

In FIG. 2B, the user data is also stored in a 512-byte sector 202 that is concurrent with the ECC coverage area and is divided into 456 9-bit symbols for ECC purposes. The ECC code 206 contains ten 9-bit symbols stored in 12 bytes. The Reed-Solomon ECC encoding of the single data sector/ECC coverage area 202 and ECC code 206 are designed to allow for the detection of 6 symbol errors and the correction of 4 of those symbol errors. It is noted that, while the ten 9-bit symbols allows an ECC detection range of 10 errors maximum or the ECC correction of 5 errors maximum, this encoding includes an additional error detection margin of 2 bits over the selected 4 bit correction ability to help foster predictable and stable operation of the ECC error correction. The additional coding ability of the ten symbol ECC check byte code over that of the five symbol ECC check byte code thus allows for an increase in the resulting error detection and correction ability. However, there is an increase the complexity of the resulting ECC algorithm and/or associated hardware, increasing access latency.

Figure 2C:
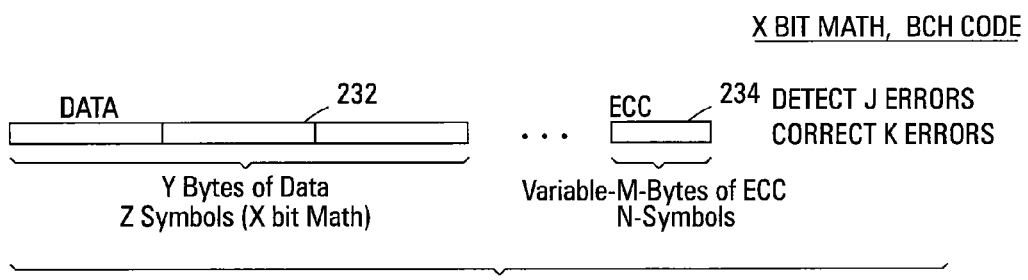

FIG. 2C details an embodiment of the present invention having a generalized ECC coverage area 232 storing Y-bytes of user data divided into Z ECC symbols using X-bit math and protected by an associated X-bit math BCH ECC check byte code 234 that has a variable size of M-bytes/N X-bit symbols. The variable size of M-bytes/N X-bit symbols of the ECC code 234 of the generalized ECC coverage area 232 allows for the detection/correction depth of the detection of J symbol errors and the correction of K symbol errors to be selected.

It is noted that other ECC coverage areas sizes/math bases, ECC encoding schemes and ECC check byte code sizes of FIGS. 2A, 2B, and 2C incorporating embodiments of the present invention will be apparent to those skilled in the art with the benefit of the present disclosure.

Figure 3A:
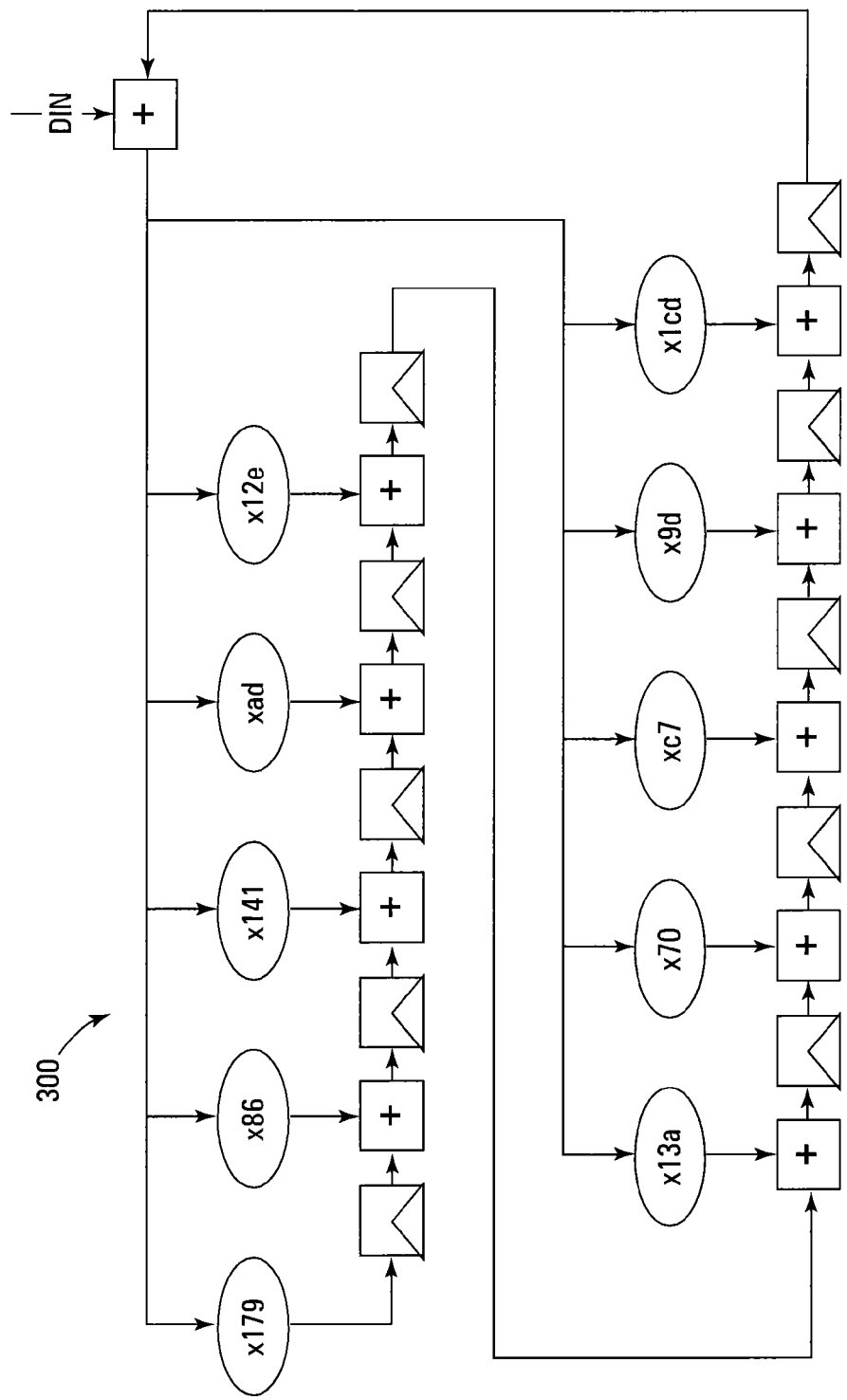
FIGS. 3A-3D detail R-S encoders, R-S Decoders and Syndrome generators in accordance with embodiments of the present invention.
Figure 3B:
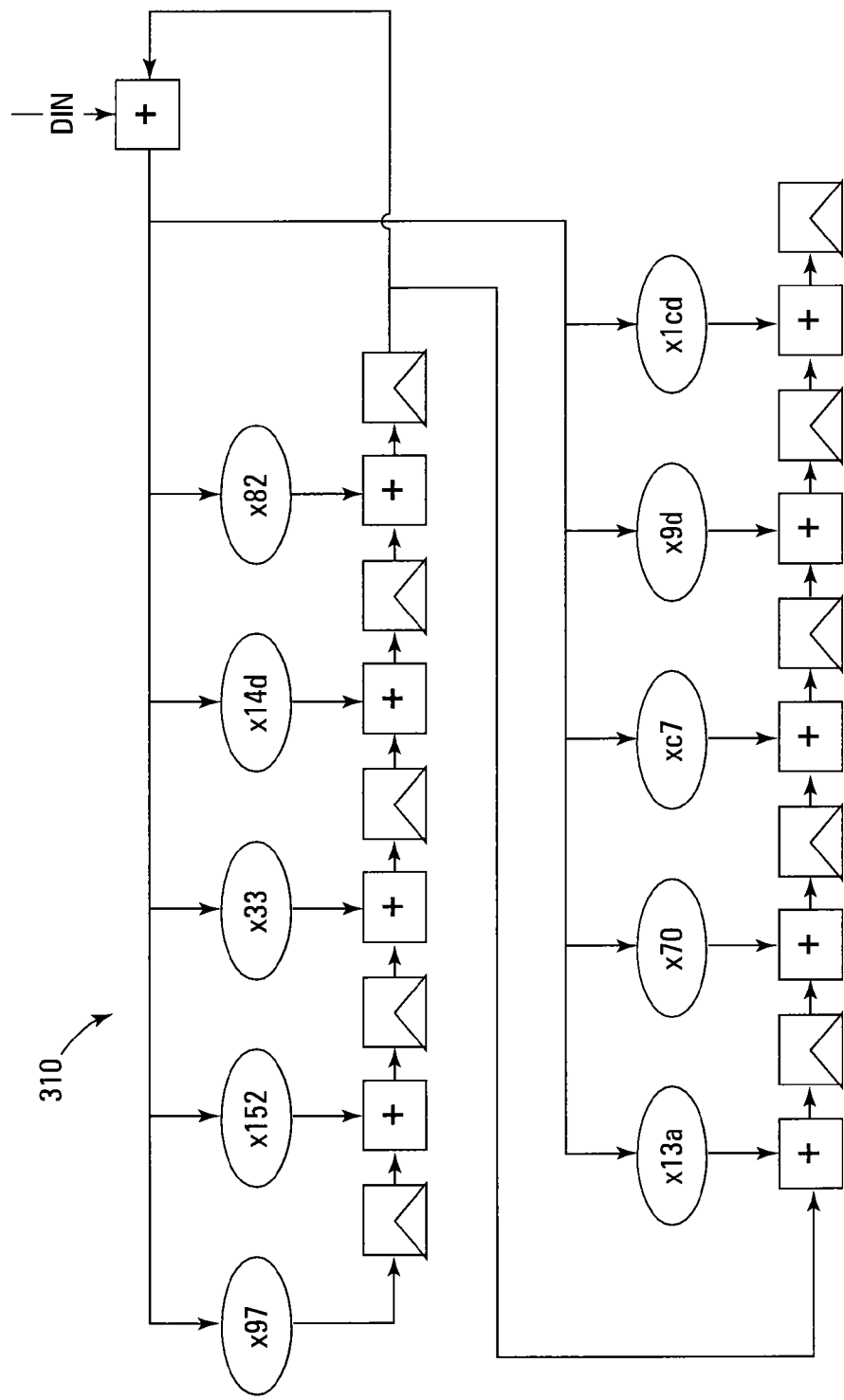

FIGS. 3A and 3B detail 9-bit Reed-Solomon ECC generators/encoders of an embodiment of the present invention. In FIG. 3A, a 10-Symbol Reed-Solomon ECC encoder/LFSR 300 is detailed. In FIG. 3B, a 5-Symbol Reed-Solomon ECC encoder/LFSR 310 is detailed. It is noted that the 5-Symbol Reed-Solomon ECC encoder 310 differs from the 10-Symbol Reed-Solomon ECC encoder 300 in that a different feedback path and coefficients are utilized for the smaller number of ECC check byte codes in the 5-Symbol encoder. It is also noted that while the 5-Symbol Reed-Solomon ECC encoder 310 and the 5-Symbol Reed-Solomon ECC encoder 300 are detailed as separate circuits, a single 5 or 10-Symbol Reed-Solomon ECC encoder can be implemented that has a selectable feedback path and selectable or loadable polynomial coefficients to allow generation of either a 5 or 10-Symbol Reed-Solomon ECC check byte codes for data that is to be written to an associated memory.

Figure 3C:
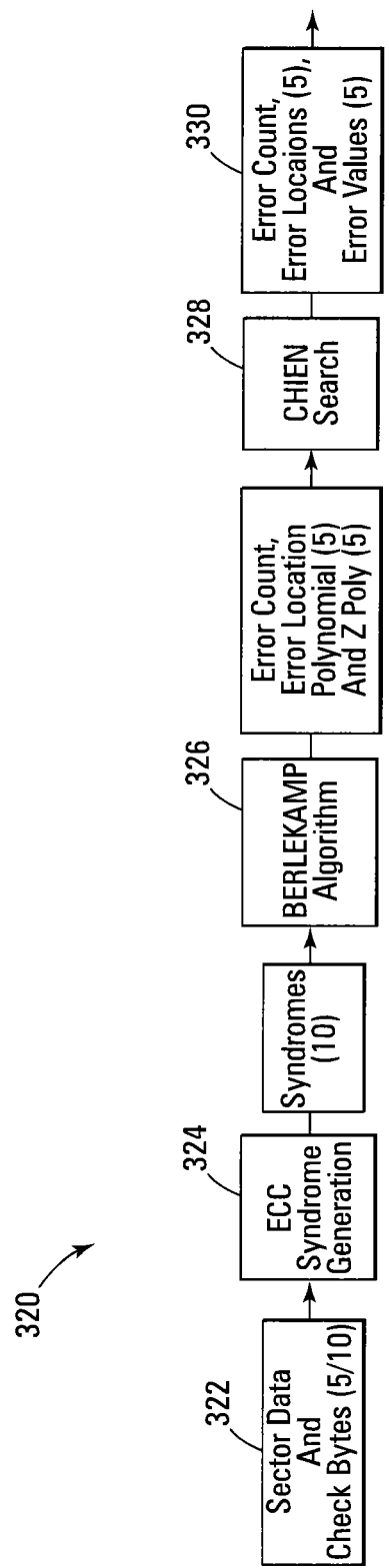
Figure 3D:
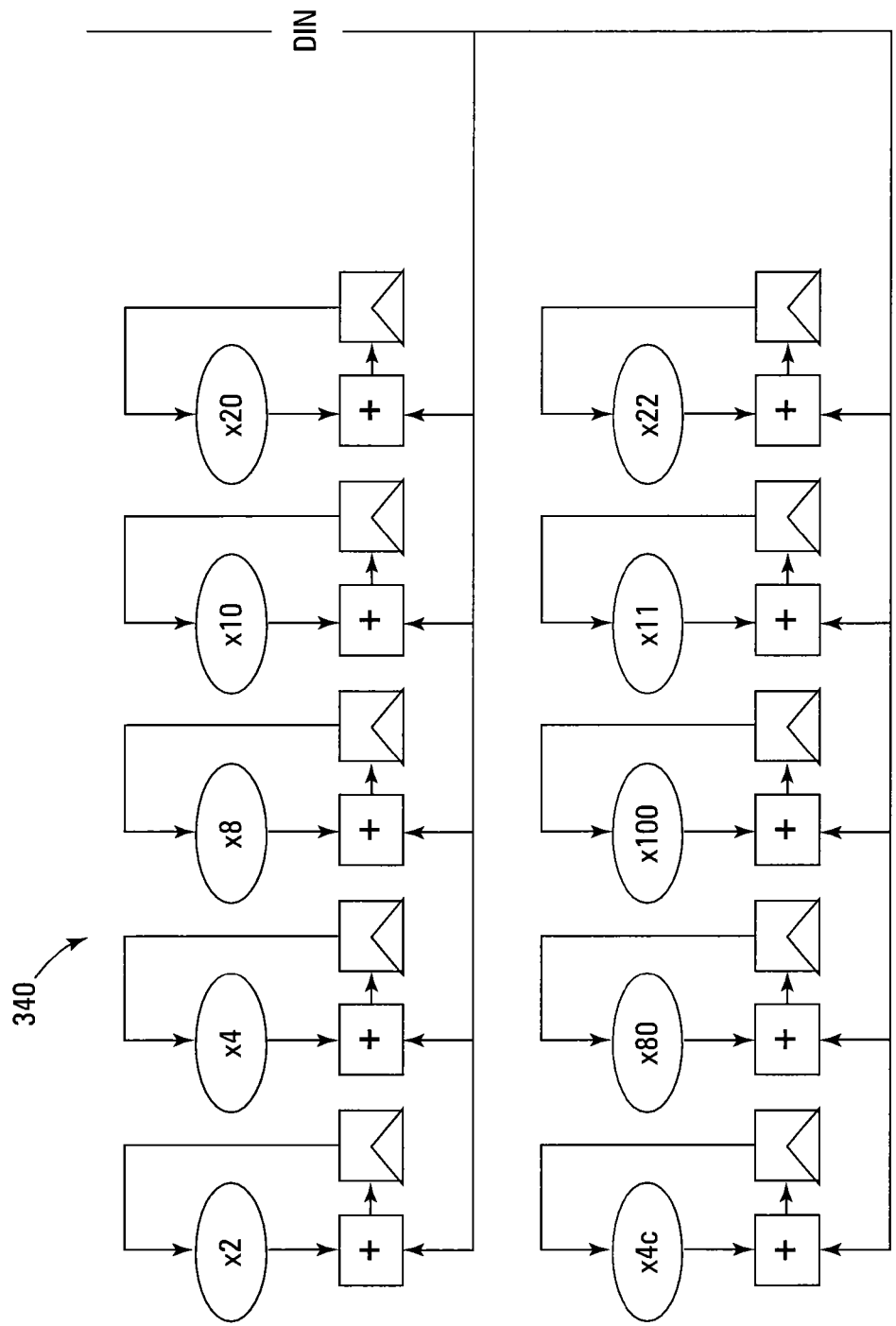

FIG. 3C details a simplified flowchart of a Reed-Solomon ECC decoder 320 (also known as an ECC Checker/ECC Syndrome Generator) of an embodiment of the present invention utilizing 9-bit math and 5 or 10 symbol ECC check byte codes. In FIG. 3C, the sector data and ECC check bytes 322 (5 or 10 symbol based) are read in by the Reed-Solomon ECC decoder 320 and syndromes generated in the Syndrome Generator 324 from the sector data to check for errors, if the generated syndromes are zero, there is no error in the read sector data. As detailed in the Syndrome Generator 340 shown in FIG. 3D, Reed-Solomon syndrome generation is not dependent on the number of symbols utilized in the ECC check byte code and thus the same Syndrome Generator 340 can be utilized for both 5 symbol and 10 symbol ECC check byte codes. If an error is detected in the read sector data by the generated syndromes being non-zero, the Reed-Solomon ECC decoder 320 executes the Berlekamp algorithm 326 to generate the error location polynomial (ELP). The Berlekamp algorithm should be designed for the largest number of ECC check byte symbols that can be utilized (10 symbols in the case of the Reed-Solomon ECC decoder 320 of FIG. 3C) the loop counters are then adjusted for the actual number of symbols being utilized. The Chien search 328 is then implemented in the Reed-Solomon ECC decoder 320 utilizing the generated ELP polynomial to locate the actual error locations by iteratively looping through each of the possible error locations of the data to check to see if each is a solution 330 to the error polynomial, if the location is a solution to the ELP it is a data error. As the Chien search 328 is an iterative walk through the data to find solutions 330 to the ELP error polynomial it does not generally have to be adjusted for the number of ECC symbols being utilized in the ECC error correction, except for having to pad the input to the Chien search 328 with zeros for the unused symbols.

Figure 4:
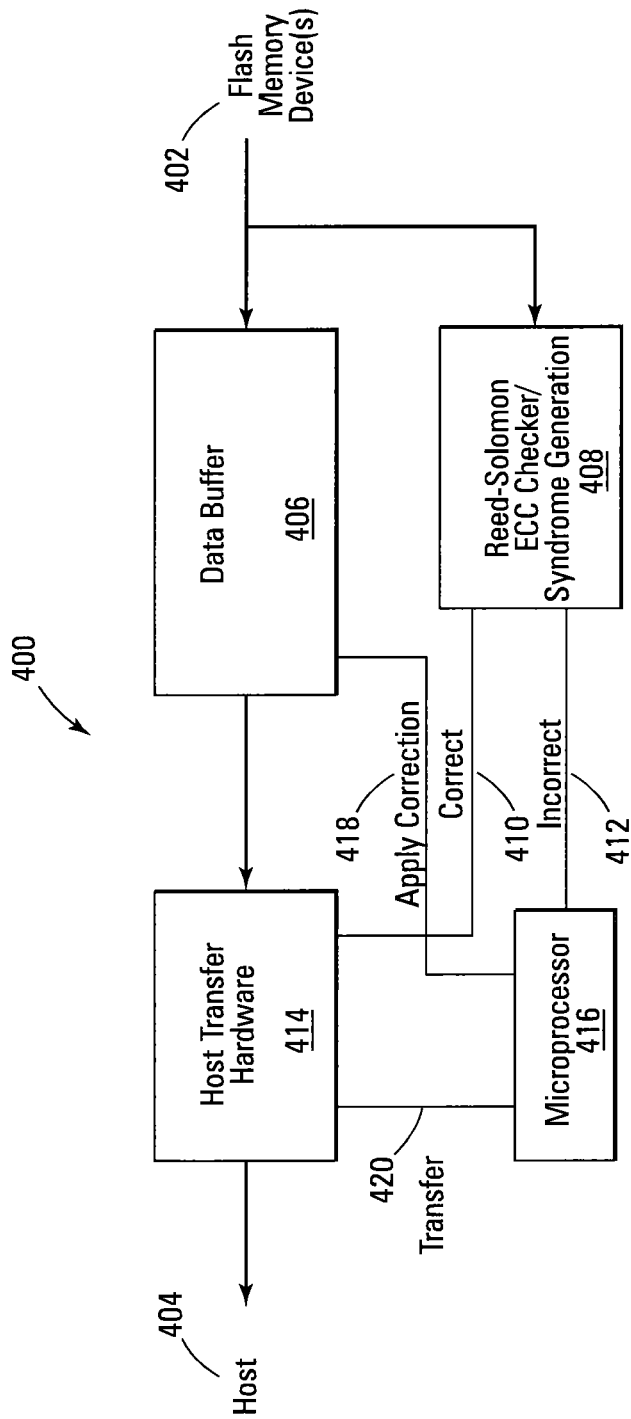
FIG. 4 details an ECC error check and correction circuit in accordance with an embodiment of the present invention.

FIG. 4 shows a simplified diagram of a memory controller output 400 of an embodiment of the present invention coupled through a memory interface 402 to one or more Flash memory devices and through a host interface 404 to an external host (not shown), which typically is a processor or computer system. In the memory controller 400, a data buffer 406 is coupled to serially receive and hold a selected data block that is serially read through the memory interface 402 from a selected Flash memory device before it is transferred from the data buffer 406 through the host interface 404 under control of the host transfer hardware 414. The serially streamed data block is also coupled to a Reed-Solomon ECC checker/syndrome generator hardware 408, which generates the syndromes from the data block and the stored ECC codes to see if they are non-zero, indicating that there is a data error. Once the data block is read and evaluated, the Reed-Solomon ECC checker/syndrome generator hardware 408 signals 410 to the host transfer hardware 414 to start the data transfer if the data block is correct (the ECC syndromes have been generated and evaluated correctly from the stored ECC codes and the data block, typically generating a string of zeros from the Reed-Solomon ECC syndrome generation hardware 408). If the data block is corrupted (the generated syndrome generation having evaluated incorrectly against the stored ECC codes and data block, typically generating a non-zero value output from the Reed-Solomon ECC syndrome generation hardware 408) the Reed-Solomon ECC checker/syndrome generator hardware 408 signals 412 a (typically internal) microprocessor or dedicated ECC correction hardware 416 to correct the errors by utilizing a Reed-Solomon ECC correction algorithm. The microprocessor 416 solves the Reed-Solomon ECC correction algorithm, using the generated syndromes to generate the error location polynomial (ELP) from the Berlekamp algorithm, and executing a Chien search using the generated ELP to determine the location of the bits to be corrected in the data block and applying the correction 418 to the data block contents held in the data buffer 406. After applying the correction to the data buffer 406, the microprocessor 416 signals 420 the host transfer hardware 414 to begin transferring the data block from the data buffer 406 out through the host interface 404.

It is noted that, although the memory controller 400 is designed to be externally coupled to one or more Flash memory devices, memory outputs that are internal to a memory device incorporating embodiments of the present invention should be apparent to those skilled in the art with the benefit of the present disclosure. It is also noted that other embodiments incorporating differing ECC code schemes and math bases are also possible and should be apparent to those skilled in the art with the benefit of the present disclosure.

The software routines that operate computer-based devices, such as the variable strength ECC code memory devices, memory systems and controllers of embodiments of the present invention, are often stored on a variety of machine-usable or computer-usable storage mediums. These software routines and drivers are often also referred to as firmware or ROM after the non-volatile ROM machine-usable storage device that such routines have historically been stored in. It is noted that such storage mediums can include, but are not limited to, a non-volatile Flash memory, a ROM, an EEPROM, a one time programmable (OTP) device, a complex programmable logic device (CPLD), an application specific integrated circuit (ASIC), a magnetic media disk, etc.

Figure 5A:
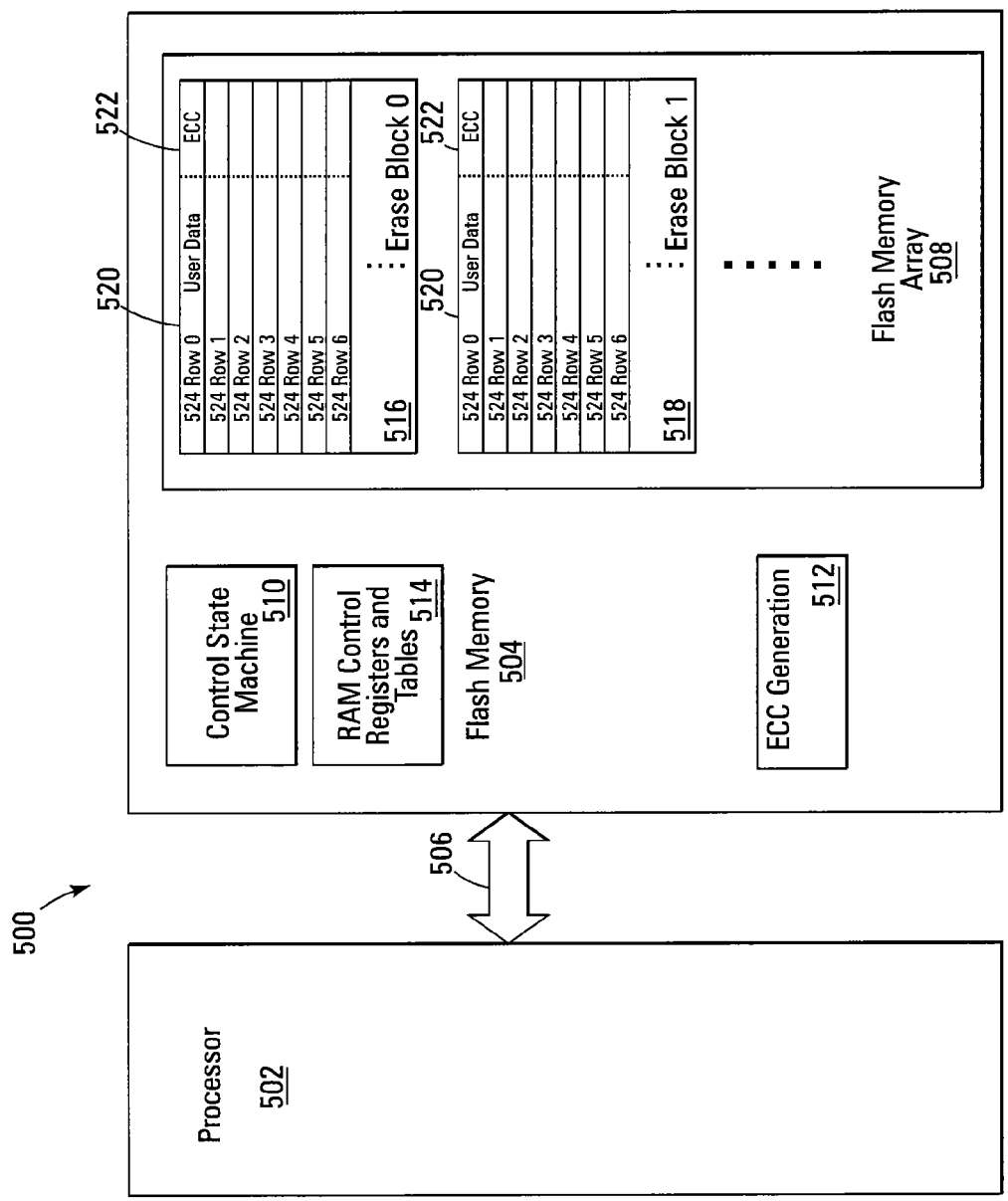
FIGS. 5A and 5B detail memory systems with memory and memory controllers with ECC generation, error check and correction circuits in accordance with embodiments of the present invention.

FIG. 5A is a simplified diagram of a system 500 that incorporates a Flash memory device 504 embodiment of the present invention. In the system 500 of FIG. 5A, the Flash memory 504 is coupled to a processor 502 with an address/data bus 506. Internally to the Flash memory device, a control state machine 510 directs internal operation of the Flash memory device; managing the Flash memory array 508 and updating RAM control registers and tables 514. The Flash memory array 508 contains floating gate memory cells arranged in a sequence of erase blocks 516, 518. Each erase block 516, 518 contains a series of physical pages, each page containing one or more logical sectors 524 (shown here for illustration purposes as a single logical sector 524 per physical page/row) that contain a user data space 520 and a control/overhead data space 522. The overhead data space 522 contains overhead information for operation of the sector 520, such as an error correction code (not shown), status flags, or an erase block management data field area (not shown). The RAM control registers and tables 514 are loaded at power up from the non-volatile erase block management registers and tables (not shown) by the control state machine 510. The user data space 520 in each logical sector 524 is typically 512 bytes long. It is noted that other interfaces to the Flash memory 504 and formats for the erase blocks 516, 518, physical pages, and sectors 524 are possible and should be apparent to those skilled in the art with benefit of the present disclosure. In FIG. 5A, the Flash memory 504 contains ECC generation and checking hardware 512 incorporating embodiments of the present invention.

Figure 5B:
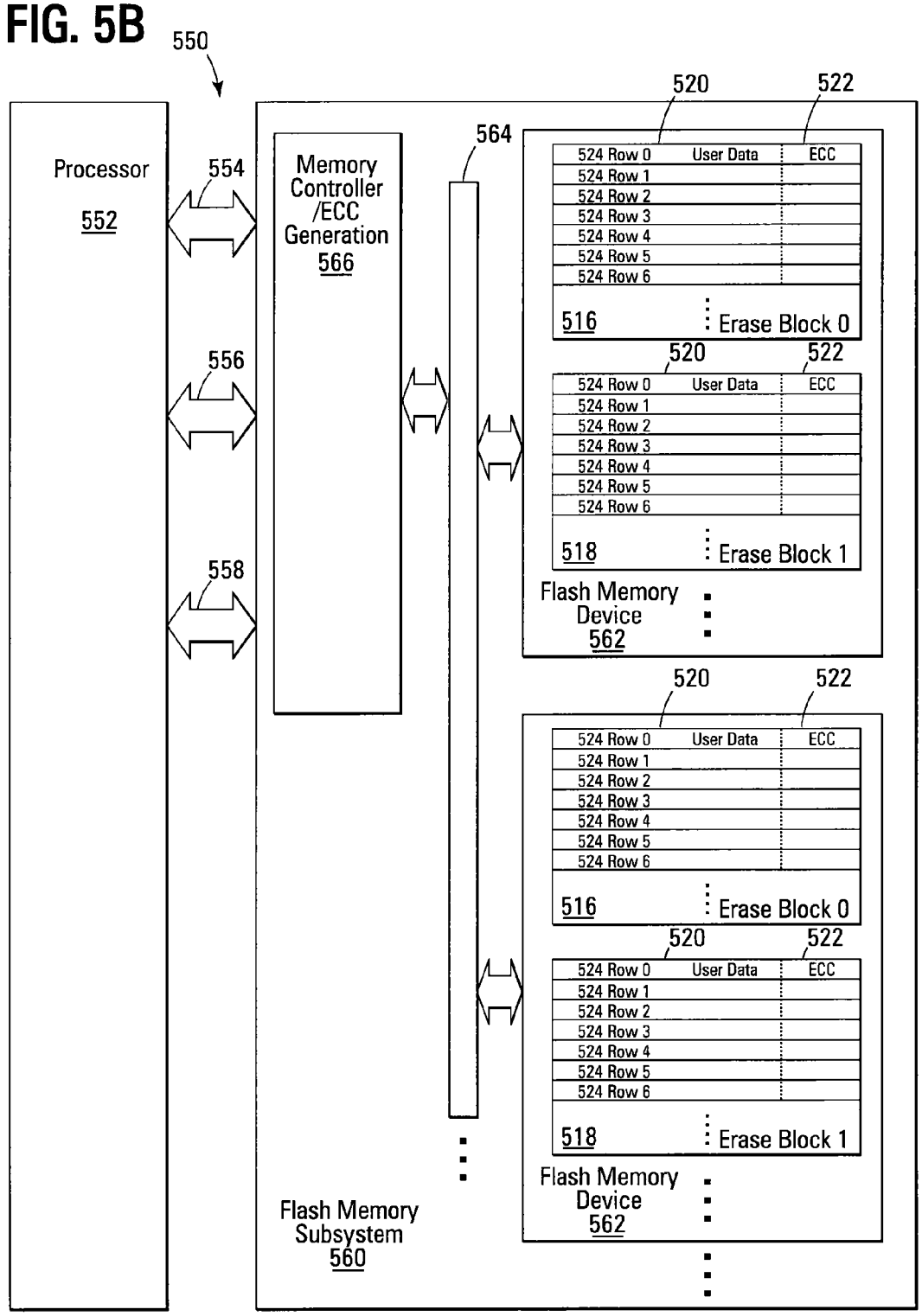

FIG. 5B is a simplified diagram of another system 550 that incorporates a Flash memory system 560 embodiment of the present invention. In the system 550 of FIG. 5B, the Flash memory system 560, such as a memory system or Flash memory card, is coupled to a processor 552 with an address 554, control 556, and data bus 558. Internal to the Flash memory system 560, a memory controller 566 directs internal operation of the Flash memory system 560; managing the Flash memory devices 562, directing data accesses, updating internal control registers and tables (not shown), and/or directing operation of other possible hardware systems (not shown) of the Flash memory system 560. The memory controller 566 has an internal ECC generation and checking hardware (not shown) that incorporates embodiments of the present invention. The memory controller 566 may optionally incorporate a small local embedded processor to help manage the Flash memory system 560. The memory controller 566 is coupled to and controls one or more Flash memory devices 562 via an internal control bus 564. It is noted that other architectures Flash memory systems 560, external interfaces 554, 556, 558, and manners of coupling the memory controller 566 to the Flash memory devices 562, such as directly coupled individual control busses and signal lines, are possible and should be apparent to those skilled in the art with benefit of the present disclosure.

The Flash memory devices 562 each contain a sequence of erase blocks 516, 518 in their internal memory arrays. Each erase block 516, 518 contains a series of physical pages, each physical page having one or more logical sectors 524 that contain a user data space 520 and a control/overhead data space 522 (shown here for illustration purposes as a single logical sector 524 per physical page/row). The overhead data space 522 contains an ECC code (not shown) and other overhead information for operation of the logical sector 520, such as status flags, or an erase block management data field area (not shown).

It is noted that the ECC checking and correction of Flash memory embodiments of the present invention can apply to other non-volatile memory types including, but not limited to, polymer memory, multi-level cells (MLC) storage, NOR Flash, NAND Flash, virtual ground, FeRAM, OUM, NROM, and MRAM and should be apparent to those skilled in the art with the benefit of the present invention.

Figure 6:
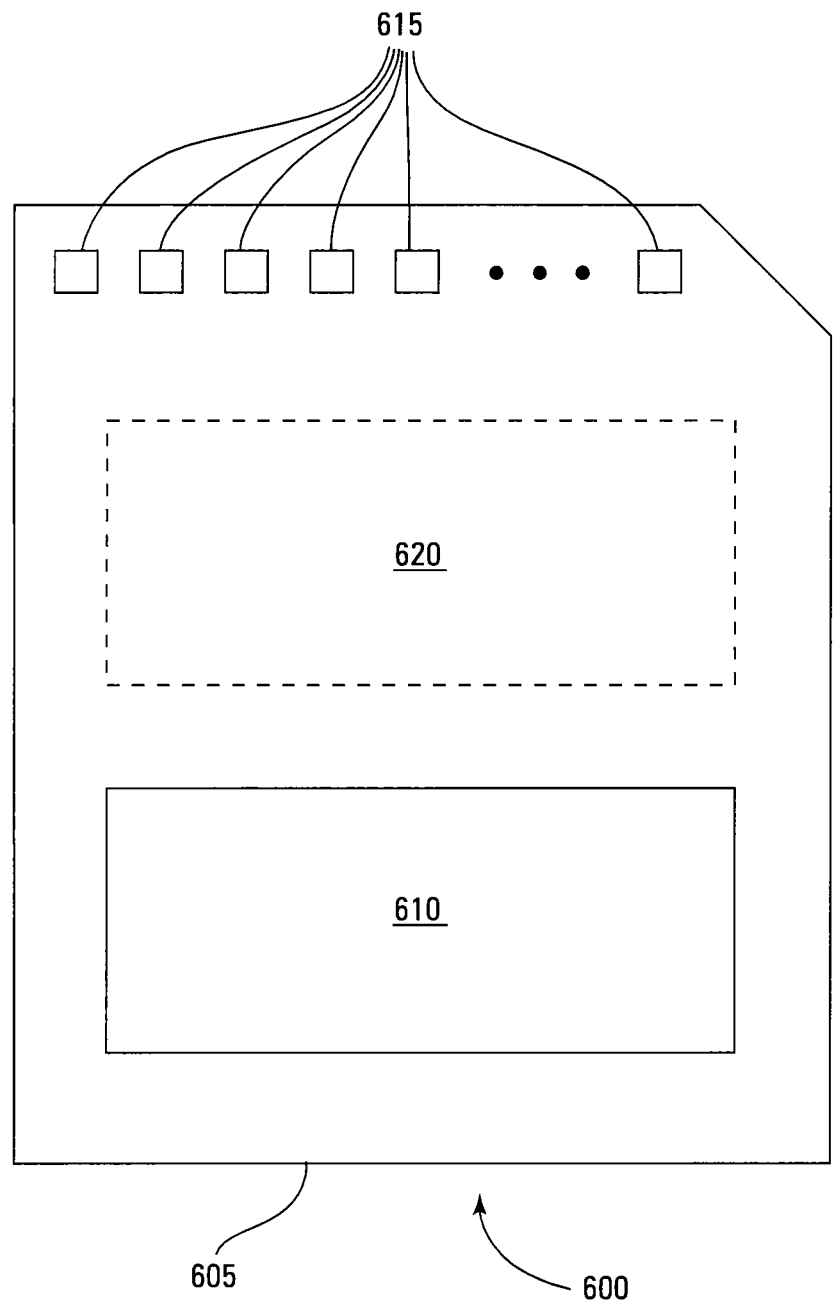
FIG. 6 is a simplified block diagram of a memory module in accordance with an embodiment of the present invention.

FIG. 6 is an illustration of a memory module 600 in accordance with an embodiment of the present invention. Memory module 600 is illustrated as a memory card, although the concepts discussed with reference to memory module 600 are applicable to other types of removable or portable memory, e.g., USB flash drives, and are intended to be within the scope of "memory module" as used herein. In addition, although one example form factor is depicted in FIG. 6, these concepts are applicable to other form factors as well.

In some embodiments, memory module 600 will include a housing 605 (as depicted) to enclose one or more memory devices 610, though such a housing is not essential to all devices or device applications. At least one memory device 610 is a non-volatile memory including circuits of or adapted to perform elements of methods of the present invention. Where present, the housing 605 includes one or more contacts 615 for communication with a host device. Examples of host devices include digital cameras, digital recording and playback devices, PDAs, personal computers, memory card readers, interface hubs and the like. For some embodiments, the contacts 615 are in the form of a standardized interface. For example, with a USB flash drive, the contacts 615 might be in the form of a USB Type-A male connector. In general, however, contacts 615 provide an interface for passing control, address and/or data signals between the memory module 600 and a host having compatible receptors for the contacts 615.

The memory module 600 may optionally include additional circuitry 620 which may be one or more integrated circuits and/or discrete components. For some embodiments, the additional circuitry 620 may include a memory controller for controlling access across multiple memory devices 610 and/or for providing a translation layer between an external host and a memory device 610. For example, there may not be a one-to-one correspondence between the number of contacts 615 and a number of I/O connections to the one or more memory devices 610. Thus, a memory controller could selectively couple an I/O connection (not shown in FIG. 6) of a memory device 610 to receive the appropriate signal at the appropriate I/O connection at the appropriate time or to provide the appropriate signal at the appropriate contact 615 at the appropriate time. Similarly, the communication protocol between a host and the memory module 600 may be different than what is required for access of a memory device 610. A memory controller could then translate the command sequences received from a host into the appropriate command sequences to achieve the desired access to the memory device 610. Such translation may further include changes in signal voltage levels in addition to command sequences.

The additional circuitry 620 may further include functionality unrelated to control of a memory device 610 such as logic functions as might be performed by an ASIC (application specific integrated circuit). Also, the additional circuitry 620 may include circuitry to restrict read or write access to the memory module 600, such as password protection, biometrics or the like. The additional circuitry 620 may include circuitry to indicate a status of the memory module 600. For example, the additional circuitry 620 may include functionality to determine whether power is being supplied to the memory module 600 and whether the memory module 600 is currently being accessed, and to display an indication of its status, such as a solid light while powered and a flashing light while being accessed. The additional circuitry 620 may further include passive devices, such as decoupling capacitors to help regulate power requirements within the memory module 600.

It is also noted that other ECC error detection and correction sequences, methods, and circuits in memory embodiments of the present invention are possible and should be apparent to those skilled in the art with benefit of the present disclosure.

CONCLUSION

Memory devices, circuitry, and data methods have been described that facilitate the detection and correction of data in memory controllers, memory systems, and/or non-volatile memory devices by allowing the number of ECC check bytes being utilized to be varied to increase or decrease the ECC check depth. This allows the depth of the ECC coverage (the overall number of bit errors detectable and/or correctable in each sector by the stored ECC check bytes) to be selected based on the application (such as increased error correction or speed of access), the amount of available data storage for ECC check bytes in the overhead/spare area associated with the sector, the version of memory device or controller being utilized, or the number of errors being seen in the memory system, device, bank, erase block, or sector (the error incidence rate), while the base data size of the area covered by the ECC check bytes (typically one or more sectors) stays the same.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A method of handling data in a memory system comprising a first memory device and a second memory device, the method comprising:
   determining a depth of error detection and/or error correction coverage for the first memory device and the second memory device of the memory system; and
   detecting and/or correcting errors in data in accordance with the determined depth of error detection and/or error correction coverage for the first memory device and the second memory device;
   wherein the determined depth of error detection and/or error correction coverage for the first memory device is independent from the determined depth of error detection and/or error correction coverage for the second memory device.

2. The method of claim 1, wherein determining a depth of error detection and/or error correction coverage comprises selecting a number of error correction code (ECC) check bytes to utilize in detecting and/or correcting errors in the data.

3. The method of claim 2, wherein the depth of error detection and/or error correction coverage comprises an overall number of bit errors detectable and/or correctable in an area covered by the ECC check bytes.

4. The method of claim 3, wherein the area covered by the ECC check bytes comprises a block of data.

5. The method of claim 4, wherein the block of data comprises a sector.

6. The method of claim 3, wherein each of the selectable number of ECC check bytes comprises a respective number (M) of bytes configured to store a respective number (N) of X-bit symbols.

7. The method of claim 3, wherein selecting a number of ECC check bytes to utilize comprises selecting a number of ECC check bytes to utilize while a base data size of the area covered by the ECC check bytes stays the same.

8. The method of claim 3, wherein selecting a number of ECC check bytes to utilize comprises selecting a number of ECC check bytes to utilize while a math base of symbols stored in the check bytes stays the same.

9. The method of claim 2, wherein selecting a number of ECC check bytes to utilize comprises selecting from two or more differing ECC check byte sizes to adjust the depth.

10. The method of claim 1, wherein determining a depth of error detection and/or error correction coverage comprises selecting a number of ECC symbols to utilize in detecting and/or correcting errors in the data.

11. The method of claim 1, wherein determining a depth of error detection and/or error correction coverage comprises determining a depth of error detection and/or error correction coverage based on an application associated with the data.

12. The method of claim 1, wherein determining a depth of error detection and/or error correction coverage comprises determining a depth of error detection and/or error correction coverage based on a desired amount of error correction coverage.

13. The method of claim 1, wherein determining a depth of error detection and/or error correction coverage comprises determining a depth of error detection and/or error correction coverage based on a desired speed of accessing the data.

14. The method of claim 1, wherein determining a depth of error detection and/or error correction coverage comprises determining a depth of error detection and/or error correction coverage based on an amount of available storage for ECC check bytes in an overhead area associated with an area of memory covered by the ECC check bytes.

15. The method of claim 1, wherein determining a depth of error detection and/or error correction coverage comprises determining a depth of error detection and/or error correction coverage based on a version of a memory device from which the data is to be accessed.

16. The method of claim 1, wherein determining a depth of error detection and/or error correction coverage comprises determining a depth of error detection and/or error correction coverage based on a version of a memory controller being utilized to access the data.

17. The method of claim 1, wherein determining a depth of error detection and/or error correction coverage comprises determining a depth of error detection and/or error correction coverage comprises based on an error rate associated with handling the data.

18. The method of claim 17, wherein the error rate comprises an instantaneous bit error rate.

19. The method of claim 17, wherein the error rate comprises an average bit error rate.

20. The method of claim 17, wherein the error rate comprises a rate of uncorrectable errors.

21. The method of claim 1, wherein determining a depth of error detection and/or error correction coverage comprises determining a depth of error detection and/or error correction coverage based on a desired depth of error detection.

22. The method of claim 1, wherein determining a depth of error detection and/or error correction coverage comprises determining a depth of error detection and/or error correction coverage based on a desired reliability of the data.

23. The method of claim 1, wherein determining a depth of error detection and/or error correction coverage comprises determining a depth of error detection and/or error correction coverage comprises based on requirements of a memory device, a memory system, and/or a memory controller associated with accessing the data.

24. The method of claim 1, wherein determining a depth of error detection and/or error correction coverage comprises determining a depth of error detection and/or error correction coverage based on an ECC check byte size.

25. The method of claim 1, wherein determining a depth of error detection and/or error correction coverage comprises determining a depth of error detection and/or error correction coverage based on an ECC code size.

26. The method of claim 1, wherein determining a depth of error detection and/or error correction coverage comprises determining a depth of error detection and/or error correction coverage based on utilization of an overhead area of an area of memory from which the data is to be accessed.

27. The method of claim 1, wherein determining a depth of error detection and/or error correction coverage comprises determining a depth of error detection and/or error correction coverage based on a type of memory being utilized to store the data.

28. The method of claim 1, wherein determining a depth of error detection and/or error correction coverage comprises determining a depth of error detection and/or error correction coverage based on a type of the data.

29. The method of claim 1, wherein determining a depth of error detection and/or error correction coverage comprises determining a depth of error detection and/or error correction coverage based on a use level of an underlying area of memory.

30. An error detection and/or correction hardware configured to:
have a selectable depth of error detection and/or error correction coverage for a first memory device coupled to the error detection and/or correction hardware and for a second memory device coupled to the error detection and/or correction hardware; and
detect and/or correct errors in data in accordance with a selected depth of error detection and/or error correction;
wherein the selectable depth of error detection and/or error correction coverage for the first memory device is independent from the selectable depth of error detection and/or error correction coverage for the second memory device.

31. The hardware of claim 30, wherein the hardware comprises an ECC syndrome generator.

32. The hardware of claim 31, wherein the ECC syndrome generator includes a plurality of selectable feedback paths, wherein each of the selectable feedback paths corresponds to a respective different one of the selectable depths.

33. The hardware of claim 31, wherein the ECC syndrome generator includes a plurality of selectable coefficients, wherein each of the selectable coefficients corresponds to a respective different one of the selectable depths.

34. The hardware of claim 30, wherein the hardware comprises an ECC checker.

35. The hardware of claim 30, comprising a plurality of ECC syndrome generators, wherein each of the generators corresponds to a different one of the selectable depths.

36. The hardware of claim 30, wherein the hardware is further configured to perform a method of handling data, the method comprising:
determining a depth of error detection and/or error correction coverage for use with the data;
selecting the determined depth of error detection and/or error correction coverage; and
detecting and/or correcting errors in the data in accordance with the selected depth of error detection and/or error correction coverage.

* * * * *

UNITED STATES PATENT AND TRADEMARK OFFICE
CERTIFICATE OF CORRECTION

| | | |
|---|---|---|
| PATENT NO. | : 8,566,675 B2 | Page 1 of 1 |
| APPLICATION NO. | : 12/814885 | |
| DATED | : October 22, 2013 | |
| INVENTOR(S) | : William H. Radke | |

It is certified that error appears in the above-identified patent and that said Letters Patent is hereby corrected as shown below:

On the title page, Item (74), under "Attorney, Agent or Firm", in column 2, line 1, delete "Polgaze," and insert -- Polglaze, --, therefor.

Signed and Sealed this
Twenty-eighth Day of January, 2014

Michelle K. Lee
*Deputy Director of the United States Patent and Trademark Office*